United States Patent
Lim et al.

(10) Patent No.: US 9,337,613 B1
(45) Date of Patent: May 10, 2016

(54) CHIP ON SUBMOUNT CARRIER FIXTURE

(71) Applicant: Western Digital Technologies, Inc., Irvine, CA (US)

(72) Inventors: Chee Kheng Lim, Pakkret (TH); Holland Hodges, Pakkret (TH)

(73) Assignee: Western Digital Technologies, Inc., Irvine, CA (US)

( * ) Notice: Subject to any disclaimer, the term of this patent is extended or adjusted under 35 U.S.C. 154(b) by 405 days.

(21) Appl. No.: 13/797,706

(22) Filed: Mar. 12, 2013

(51) Int. Cl.
*G01R 31/26* (2014.01)
*H01S 5/022* (2006.01)

(52) U.S. Cl.
CPC .................................. *H01S 5/02236* (2013.01)

(58) Field of Classification Search
None
See application file for complete search history.

(56) References Cited

U.S. PATENT DOCUMENTS

| | | | |
|---|---|---|---|
| 5,234,149 A | 8/1993 | Katz et al. | |
| 5,656,943 A | 8/1997 | Montoya et al. | |
| 5,694,048 A | 12/1997 | Boudreau et al. | |
| 5,808,474 A | 9/1998 | Hively et al. | |
| 5,821,746 A | 10/1998 | Shelor | |
| 6,188,028 B1 * | 2/2001 | Haba ...................... | H05K 3/325 174/255 |
| 6,486,660 B1 | 11/2002 | Luse et al. | |
| 6,590,165 B1 * | 7/2003 | Takada .................. | H01L 21/486 174/260 |
| 6,623,997 B2 | 9/2003 | Chang et al. | |
| 6,804,276 B2 | 10/2004 | Gen-ei et al. | |
| 6,943,971 B2 | 9/2005 | Kainuma et al. | |
| 7,165,462 B2 | 1/2007 | Luo et al. | |
| 7,368,905 B2 | 5/2008 | Grinberg et al. | |
| 7,371,017 B1 | 5/2008 | Shi et al. | |
| 7,449,905 B2 | 11/2008 | Shi et al. | |
| 7,471,081 B2 | 12/2008 | Kainuma et al. | |
| 7,522,649 B2 | 4/2009 | Ha et al. | |
| 2008/0316872 A1 | 12/2008 | Shimizu et al. | |
| 2012/0147717 A1 | 6/2012 | Shimazawa et al. | |
| 2013/0333934 A1 * | 12/2013 | Hurwitz .............. | H01L 23/3677 174/262 |

* cited by examiner

*Primary Examiner* — Paresh Patel

(57) ABSTRACT

Heat assisted magnetic recording uses a laser diode (LD) to provide energy during the writing process. The LD is bonded on a submount chip which is referred to as the Chip-On-Submount-Assembly (COSA). COSA devices undergo burn-in and testing in COSA burn-in fixtures, which include a first non-conductive layer having through holes and a second conductive layer having first openings. The second conductive layer is disposed over the first non-conductive layer with each of the first openings overlaying one of the through holes. COSA burn-in fixtures also include a third non-conductive layer having second openings that are larger than the first openings. The third non-conductive layer is disposed over the second conductive layer with each of the second openings overlaying one of the first openings, which forms pockets with a seat on the conductive layer for disposing the LD with one electrode in contact with the conductive layer.

5 Claims, 9 Drawing Sheets

CHIP ON SUBMOUNT CARRIER FIXTURE

FIELD

The present disclosure relates generally to processes and apparatuses used for laser diode testing, and more particularly, to processes and apparatuses used to reduce the cost and time for laser diode testing.

BACKGROUND

Magnetic disk drives are used to store and retrieve data in many electronic devices including computers, televisions, video recorders, servers, digital recorders, etc. A typical magnetic disk drive includes a head having a slider and a transducer with a read and write element that is in very close proximity to a surface of a rotatable magnetic disk. As the magnetic disk rotates beneath the head, a thin air bearing is formed between the surface of the magnetic disk and an air bearing surface (ABS) of the slider. The read and write elements of the head are alternatively used to read and write data while a suspension assembly positions the head along magnetic tracks on the magnetic disk. The magnetic tracks on the magnetic disks are typically concentric circular regions on the magnetic disks, onto which data can be stored by writing to it and retrieved by reading from it.

The slider is aerodynamically designed to fly above a rotating magnetic disk by virtue of an air bearing created between the ABS of the slider and the rotating magnetic disk. The ABS is the portion of the slider surface which is closest to the rotating magnetic disk, which is typically the head portion of the slider. The slider can also support a laser source that provides energy during writing in processes such as a heat assisted magnetic recording (HAMR) process. HAMR is a process used for recording information on magnetic medium having high coercivity. Magnetic medium having a large magnetic anisotropy constant Ku is sometimes preferred because it is thermally more stable than magnetic medium having a small Ku. Since magnetic medium with high Ku also has high coercivity, in cases where high Ku magnetic media is preferred, the preferred medium also has high coercivity. Recording information onto high Ku magnetic medium can be difficult because of the coercive forces of the magnetic recording medium. HAMR makes it easier to record onto a high Ku magnetic medium by applying heat with the use of a laser diode (LD), which is mounted onto the slider near the head.

HAMR uses a laser source to provide energy during the writing process. The energy source comes from an LD chip that is attached to a power source. The LD is also attached to the back of the slider and the light energy is guided to the ABS surface through a waveguide to heat the medium film for writing.

LD devices are often tested and screened before they are selected for use in a magnetic disk drive. The LD testing and screening processes are performed as part of a burn-in process of the LD. The burn-in process is used to screen out LD devices having "infant mortality" but often do not fail until they are used for some time. Incorporating testing and screening with the burn-in process helps reduce the number of magnetic hard drives that fail in the field as a result of having the LD devices fail. During the burn-in process, the LD is loaded into a fixture and heated at an elevated temperature for several hours with the LD energized.

Fixtures that are currently used to burn-in and test LD devices typically have contact probes as part of the fixture. The functions of the contact probes are to hold the LD devices in place on the fixture and to make electrical contact to the P-side and N-side of the LD. However these fixtures, which are currently used, have drawbacks. The integrated contact probes and moving shims, which are used to "lock" the components, are expensive to fabricate due to their complex design and are expensive to maintain because it is difficult to align and maintain the probes. Existing fixture designs are also limited in the number of LD devices that the fixture can support due to the probe design. Further, existing fixture designs are difficult to work with because it is difficult to load LD devices into the existing fixtures.

Therefore, what is needed is a system and method for LD testing and screening that is less expensive to use and maintain than existing fixtures while at the same time increases the number of devices per fixture, and provides for easy automated loading of the fixture.

SUMMARY

Several aspects of the present invention will be described more fully hereinafter with reference to various embodiments of apparatuses and methods related to LD testing and to ways of reducing the cost and time of LD testing.

One aspect of a system used for LD testing includes a first non-conductive layer having a plurality of through holes and a second conductive layer having a plurality of first openings. The second conductive layer is disposed over the first non-conductive layer with each of the plurality of first openings overlaying one of the plurality of through holes. The aspect of the system also includes a third non-conductive layer having a plurality of second openings that are larger than the plurality of first openings. The third non-conductive layer is disposed over the second conductive layer with each of the plurality of second openings overlaying one of the plurality of first openings. The plurality of first openings and the plurality of second openings form a plurality of pockets with a seat on the conductive layer.

Another aspect of a system used for LD testing includes a plurality of LD submount assemblies and a holder that holds the plurality of LD submount assemblies. Each LD submount assembly includes an LD, which has a first contact, and a submount, which has a second contact. The LD is disposed on the submount. The holder includes a first non-conductive layer having a plurality of through holes, a second conductive layer having a plurality of first openings, and a third non-conductive layer having a plurality of second openings that are larger than the plurality of first openings. The second conductive layer is disposed over the first non-conductive layer. The third non-conductive layer is disposed over the second conductive layer with each of the plurality of second openings overlaying one of the plurality of first openings. The plurality of first openings and the plurality of second openings form a plurality of pockets with a seat on the conductive layer. The plurality of submount assemblies is disposed within the plurality of pockets with the second contact of the submount making electrical contact with the second conductive layer at the seat and each LD being disposed within one of the first openings.

Another aspect of a method used for LD testing includes providing a first non-conductive layer having a plurality of through holes, stacking a second conductive layer, which has a plurality of first openings, over the first non-conductive layer, and stacking a third non-conductive layer having a plurality of second openings that are larger than the plurality of first openings over the second conductive layer with each of the plurality of second openings overlaying one of the plurality of first openings. The plurality of first openings and the plurality of second openings form a plurality of pockets with a seat on the conductive layer. The aspect of the method also includes providing a plurality of LD submount assemblies, wherein each LD submount assembly includes an LD and is disposed on a submount. The LD includes a first contact and the submount includes a second contact. The aspect further includes disposing the plurality of laser diode submount assemblies in the plurality of pockets with the second contact of the submount making electrical contact with the second conductive layer at the seat and each LD being disposed within one of the first openings.

It will be understood that other aspects of the present invention will become readily apparent to those skilled in the art from the following disclosure, wherein it is shown and described only several embodiments of the invention by way of illustration. As will be realized by those skilled in the art, the present invention is capable of other and different embodiments and its several details are capable of modification in various other respects, all without departing from the spirit and scope of the invention. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein:

FIG. 8 is an illustration showing two rows of COSA devices mounted in a COSA burn-in fixture orientated to allow measurement of COSA laser power output during burn-in.

DETAILED DESCRIPTION

Figure 1:
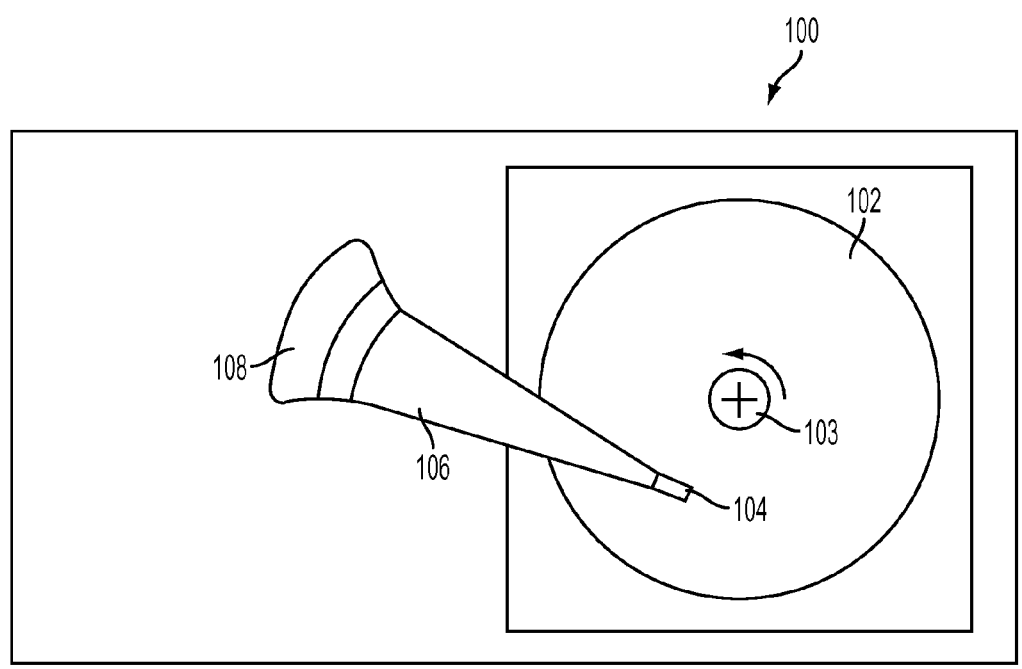
FIG. 1 is a conceptual view an exemplary embodiment of a magnetic disk drive that incorporates a magnetic head and slider.

The detailed description is intended to provide a description of various exemplary embodiments of the present invention and is not intended to represent the only embodiments in which the invention may be practiced. The term "exemplary" used throughout this disclosure means "serving as an example, instance, or illustration," and should not necessarily be construed as preferred or advantageous over other embodiments. The detailed description includes specific details for the purpose of providing a thorough and complete disclosure that fully conveys the scope of the invention to those skilled in the art. However, the invention may be practiced without these specific details. In some instances, well-known structures and components may be shown in block diagram form, or omitted entirely, in order to avoid obscuring the various concepts presented throughout this disclosure.

Various aspects of the present invention may be described with reference to certain shapes and geometries. Any reference to a component having a particular shape or geometry, however, should not be construed as limited to the precise shape illustrated or described, but shall include deviations that result, for example, from manufacturing techniques and/or tolerances. By way of example, a component, or any part of a component, may be illustrated or described as rectangular, but in practice may have rounded or curved features due to manufacturing techniques and/or tolerances. Accordingly, the components illustrated in the drawings are schematic in nature and their shapes are not intended to illustrate the precise shape of the component, and therefore, not intended to limit the scope of the present invention.

In the following detailed description, various aspects of the present invention will be presented in the context of lapping row bars during the fabrication of magnetic heads used in magnetic disk drives. While these inventive aspects may be well suited for this application, those skilled in the art will realize that such aspects may be extended to other applications. Accordingly, any reference to apparatuses and methods related to lapping row bars during magnetic head fabrication processes, which are used in magnetic disk drives, is intended only to illustrate the various aspects of the present invention, with the understanding that such aspects may have a wide range of applications.

FIG. 1 is a conceptual view of an exemplary magnetic disk drive. The magnetic disk drive 100 is shown with a rotatable magnetic disk 102. The magnetic disk 102 may be rotated on a spindle 103 by a disk drive motor (not shown) located under the magnetic disk 102. A head 104, which can be a perpendicular magnetic recording (PMR) head or lateral magnetic recording (LMR) head, may be used to read and write information by detecting and modifying the magnetic polarization of the recording layer on the disk's surface. The head 104 is generally integrally formed with a carrier or slider (not shown). The function of the slider is to support the head 104 and any electrical connections between the head 104 and the rest of the magnetic disk drive 100. The slider is mounted to a positioner arm 106 which may be used to move the head 104 on an arc across the rotating magnetic disk 102, thereby allowing the head 104 to access the entire surface of the magnetic disk 102. The positioner arm 106 comprises a head gimbal assembly (HGA), which includes a load beam and a gimbal disposed on the end of the load beam, and an actuator unit 108. The positioner arm 106 may be moved using a voice coil actuator, which is part of the actuator 108, or by some other suitable means.

The slider is aerodynamically designed to fly above the magnetic disk 102 by virtue of an air bearing created between the surface of the slider and the rotating magnetic disk 102. This surface of the slider is referred to as an air bearing surface (ABS). The ABS is the portion of the slider surface which is closest to the rotating magnetic disk 102, which is typically the head 104. In order to maximize the efficiency of the head 104, the sensing elements (i.e., the read and write heads) are designed to have precise dimensional relationships to each other. In addition, the distance between the ABS and the rotating magnetic disk 102 is tightly controlled. The dimension that relates to the write function is known as the throat height and the dimension that relates to the read function is known as the stripe height. Both the stripe height and the throat height are controlled by a lapping process.

The slider can also support a laser source that provides energy during a writing process, such as in a heat assisted magnetic recording (HAMR) process. HAMR is a process used for recording information on magnetic medium having high coercivity. Magnetic medium having a large magnetic anisotropy constant Ku is sometimes preferred because it is thermally more stable than magnetic medium having a small Ku. Since magnetic medium with high Ku also has high coercivity, in cases where high Ku magnetic media is preferred, the preferred medium also has high coercivity. Recording information onto high Ku magnetic medium can be difficult because of the coercive forces of the magnetic recording medium. HAMR makes it easier to record onto high Ku magnetic medium by applying heat with a laser diode (LD), along with a magnetic field, at the time of recording so that coercive forces are reduced. The energy source comes from a laser diode (LD) chip bonded on a submount chip which is referred to as the Chip-On-Submount-Assembly (COSA). The COSA is attached to the back of the slider and the light energy is guided to the ABS surface through a waveguide to heat the medium film for writing.

Figure 2:
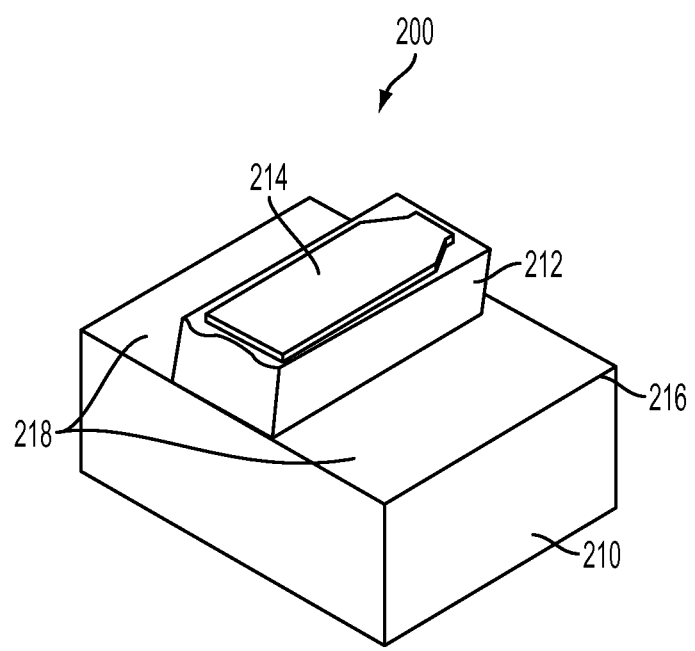
FIG. 2 is an illustration showing the main body of a Chip-On-Submount-Assembly (COSA).

FIG. 2 is an illustration showing the main body of a COSA 200, which includes a submount 210 and a laser diode (LD) 212. LD 212 can be an edge type emitting LD with a first electrode underneath (not shown) and a second electrode 214 disposed on top of LD 212. In one embodiment the first electrode is an n-electrode that is electrically coupled to an n-electrode of LD 212 and the second electrode is a p-electrode that is electrically coupled to a p-electrode of LD 212. In another embodiment the first electrode is a p-electrode that is electrically coupled to a p-electrode of LD 212 and the second electrode is an n-electrode that is electrically coupled to an n-electrode of LD 212.

Submount 210 is made from a substrate, such as silicon, and has a first electrical pad 218 disposed on top of a mounting surface 216 of submount 210. Mounting surface 216 can be covered with an insulation layer. The insulating layer separates the top of the substrate from the first electrical pad 218 and is used to electrically isolate the first electrical pad 218 from the substrate as well as provide electrical isolation to LD 212. LD 212 is mounted on a mounting surface 216 of submount 210 so that a first electrode of LD 212 is electrically coupled and firmly attached to the first electrical pad 218, by soldering or other means. Second electrode 214 can include a second electrical pad formed directly or indirectly on the second electrode 214 to fan out the electrical contact area for the second electrode 214.

The first electrical pad 218, which is electrically connected to the first electrode, can be electrically connected with a connection wiring disposed at a head gimbal assembly (HGA) supporting the magnetic head 104 by an appropriate method such as wire bonding, etc. Similarly, the second electrode 214 can be connected with the wiring of the HGA by an appropriate method such as wire bonding. During operation of the magnetic disk device 100, current is supplied to LD 212 from a power source of the magnetic disk device 100 through the first electrical pad 218, which is electrically connected to the first electrode, and the second electrode 214.

During fabrication of the magnetic disk drive 100, COSA 200 undergoes a burn-in process along with testing of LD 212. The burn-in process is used to screen out laser diodes with "infant mortality" and to perform a characteristic assessment of LD 212. During the burn-in process, COSA 200 is loaded into a COSA burn-in fixture and heated at an elevated temperature for a predetermined time (i.e. several hours) with the laser diode energized. The burn-in process includes a test that measures and assesses variation over time of LD 212 light output at high temperatures while a current passes through LD 212.

Figure 3A:
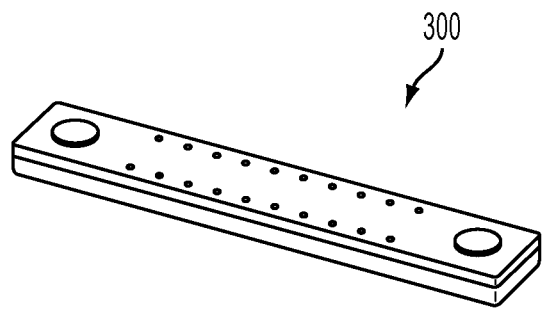
FIG. 3A is an illustration showing perspective view of a COSA burn-in fixture with COSA devices loaded into the fixture.

FIG. 3A is an illustration showing perspective view of a COSA burn-in fixture 300 with COSA 200 devices loaded into the fixture. COSA burn-in fixture 300 is used to perform burn-in and test of LD 212. COSA burn-in fixture 300 is made of shims with pre-fabricated pockets or openings having layers of interleaving conducting and non-conducting material, as explained with reference to FIG. 3B.

Figure 3B:
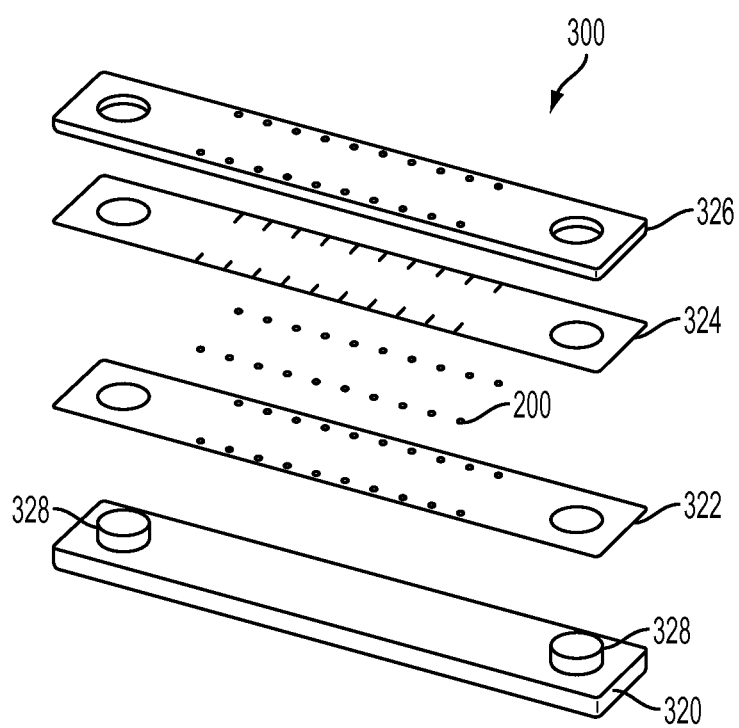
FIG. 3B is an illustration showing the components of COSA burn-in fixture 300, with COSA devices, illustrated in FIG. 3A.

FIG. 3B is an illustration showing the components of COSA burn-in fixture 300 with COSA 200 devices illustrated in FIG. 3A. COSA burn-in fixture 300 is made of shims with pre-fabricated pockets or openings having three layers of interleaving conducting and non-conducting material. COSA burn-in fixture 300 includes a base plate 320, a plate holder 322, a conductive plate 324, a top plate 326, and an alignment pin 328. Base plate 320 is a metallic layer which serves as the base or foundation for the subsequent COSA burn-in fixture 300 layers. The plate holder 322 is a non-conducting layer with an opening bigger than the width of COSA 200. The thickness of this plate holder 322 is less than the thickness of the submount 210.

Conductive layer 324, which is the middle layer and is made of a conductive material, has an opening bigger than the width of LD 212 of COSA 200 device. The thickness of conductive layer 324 is greater than the thickness of LD 212, as described in more detail with reference to FIGS. 6A-6C. Conductive layer 324 is used to make electrical contact to the first electrical pad 218, which is electrically connected to the first electrode. In the embodiment where the first electrode is an n-electrode, conductive layer 324 is used to make electrical contact to the N-side on LD 212 and COSA 200. Alternatively, in the embodiment where the first electrode is a p-electrode, conductive layer 324 is used to make electrical contact to the p-side on LD 212 and COSA 200.

Top plate 326 is a non-conductive layer with a through hole. The through hole forms an opening that is bigger or smaller than the width of LD 212. The thickness of top plate 326 can be less than or greater than the thickness of LD 212. Plate holder 322, conductive plate 324 and top plate 326 are stacked such that they form pockets for holding COSA 200 devices. COSA 200 devices are disposed in the pockets. Plate holder 322, conductive plate 324, top plate 326, and COSA 200 devices are all pressed together and secured to the base plate 320 using alignment pin 328. Electrical contact to the second electrode of LD 212 is made through the opening on top plate 326. In the embodiment where the second electrode is a p-electrode, electrical contact to the p-side on LD 212 is made through the opening on top plate 326. Alternatively, in the embodiment where the second electrode is an n-electrode, electrical contact to the n-side on LD 212 is made through the opening on top plate 326.

Figure 4A:
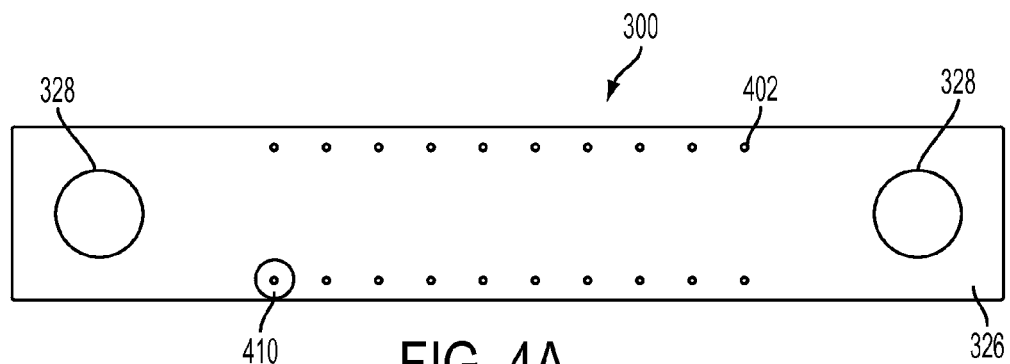
FIG. 4A is an illustration showing a top view of COSA burn-in fixture 300, with COSA devices, illustrated in FIG. 3A.
Figure 4B:
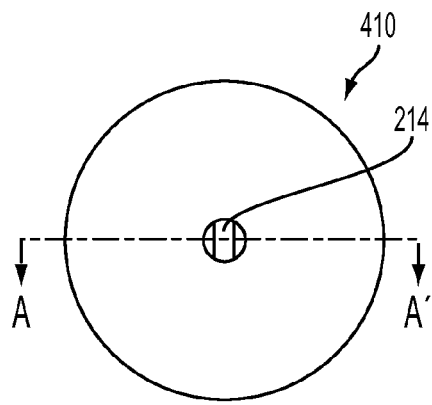
FIG. 4B is an enlarged view of region 410 identified as a circle in the top view of the COSA burn-in fixture illustrated in FIG. 4A.

FIG. 4A is an illustration showing a top view of COSA burn-in fixture 300 with COSA 200 devices, illustrated in FIG. 3A. The top view of COSA burn-in fixture 300 shows top plate 326 with openings 402 (20 shown) and the top of alignment pins 328. The openings 402 provide a path to access the second electrode of LD 212. FIG. 4B is an enlarged view of region 410 identified as a circle in the top view of COSA burn-in fixture 300, which is illustrated in FIG. 4A. The enlarged region 410 illustrates openings 402 in top plate 326 with the second electrode 214, which is located on the top portion of LD 212, being exposed.

Figure 4C:
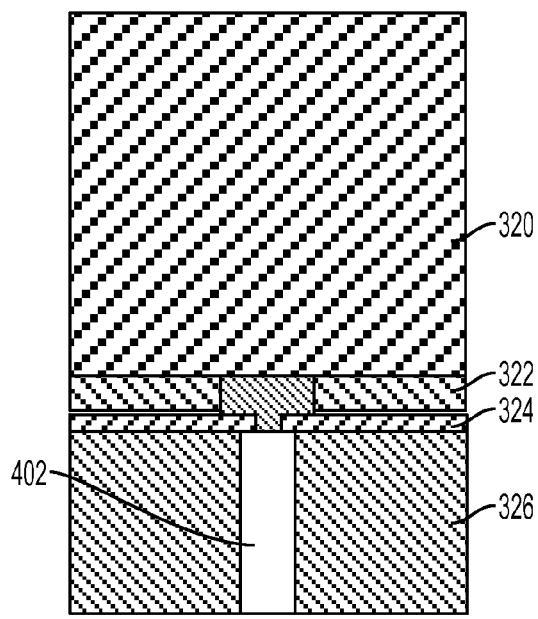
FIG. 4C is an enlarged cross sectional view along cutline A-A' illustrated in the enlarged view of the COSA burn-in fixture illustrated in FIG. 4B.

FIG. 4C is an enlarged cross sectional view along cutline A-A' illustrated in the enlarged view of COSA burn-in fixture 300 shown in FIG. 4B. The cross sectional view along cutline A-A' shows base plate 320, plate holder 322, conductive plate 324, top plate 326 with openings 402, and COSA 200 device disposed in COSA burn-in fixture 300.

Figure 5A:
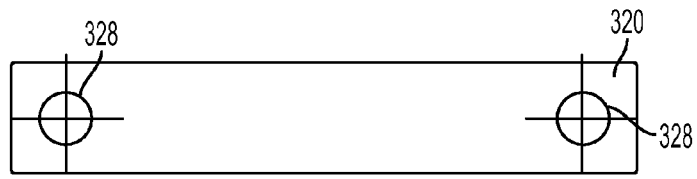
FIG. 5A is an illustration showing a top view of base plate 320 depicted in FIG. 3A.

FIG. 5A is an illustration showing a top view of base plate 320 with holes for alignment pins 328, as depicted in FIG. 3A. Base plate 320 can be made of a metallic material such as aluminum, stainless steel, etc. Base plate 320 can also be rectangular in shape. In one embodiment, base plate 320 is fabricated using etching methods.

Figure 5B:
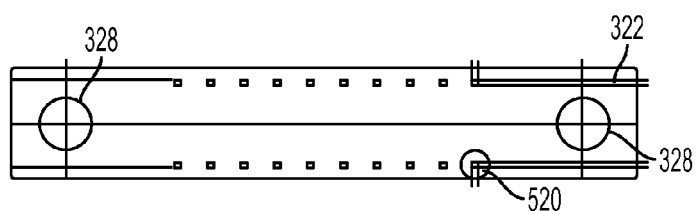
FIG. 5B is an illustration showing a top view of plate holder 322 depicted in FIG. 3A.
Figure 5C:
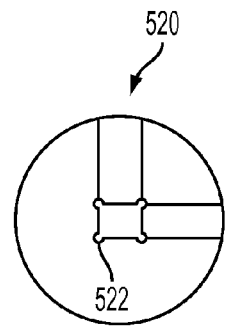
FIG. 5C is an enlarged view of region 520 identified as a circle in the top view of plate holder 322, which is illustrated in FIG. 5B.

FIG. 5B is an illustration showing a top view of plate holder 322 depicted in FIG. 3A. Plate holder 322 is a non-conducting layer having a shape similar to base plate 320 and having an opening bigger than the width of COSA 200 device. Plate holder 322 can be made of a non-conductive material such as a polymer, plastic, ceramic, etc. FIG. 5C is an enlarged view of region 520 identified as a circle in the top view of plate holder 322, which is illustrated in FIG. 5B. Region 520 shows that plate holder openings 522 have a shape that is either square or rectangular with circular corners. In one embodiment, plate holder 322 is fabricated using etching methods.

Figure 5D:
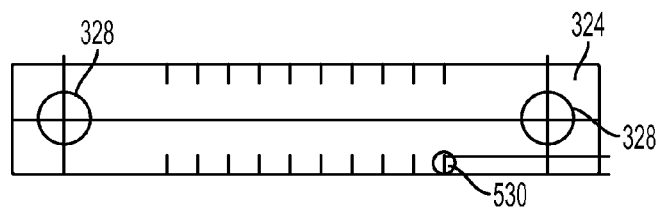
FIG. 5D is an illustration showing a top view of conductive plate 324 depicted in FIG. 3A.
Figure 5E:
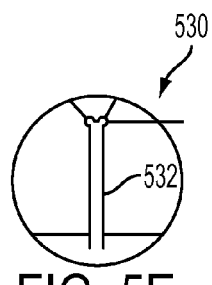
FIG. 5E is an enlarged view of region 530 identified as a circle in the top view of conductive plate 324, which is illustrated in FIG. 5D.

FIG. 5D is an illustration showing a top view of conductive plate 324 depicted in FIG. 3A. Conductive plate 324 can be made of a metallic material such as copper, aluminum, stainless steel, etc. Conductive plate 324 is a conducting layer having a shape similar to base plate 320 and/or plate holder 322 and has an opening bigger than the width of LD 212, which is part of COSA 200 device. The thickness of conductive layer 324 is also greater than the thickness of LD 212. FIG. 5E is an enlarged view of region 530 identified as a circle in the top view of conductive plate 324, which is illustrated in FIG. 5D. Region 530 shows that conductive plate 324 has light channels 532 that extend from where LD 212 is disposed to the outer edge of conductive plate 324. The light channels 532 in conductive plate 324 are openings that allow light, which is emitted from LD 212, to escape COSA burn-in fixture 300 for testing. In one embodiment, conductive plate 324 is fabricated using etching methods.

Figure 5F:
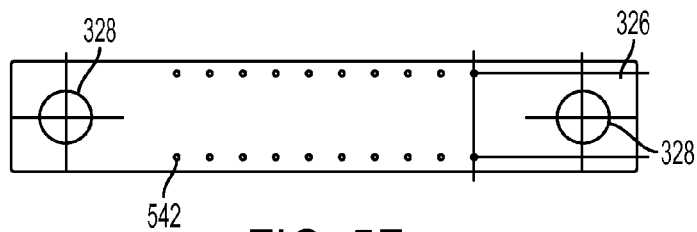
FIG. 5F is an illustration showing a top view of top plate 326 depicted in FIG. 3A.

FIG. 5F is an illustration showing a top view of top plate 326 depicted in FIG. 3A. Top plate 326 can have a thickness that is less than the thickness of LD 212 and is made of a non-conductive layer material such as a polymer, plastic, ceramic, etc. Top plate 326 also has a through hole that forms a top plate opening 542 that can be bigger or smaller than the width of submount 210 or the width of LD 212. In one embodiment, top plate 326 is fabricated using etching methods.

Figure 5G:
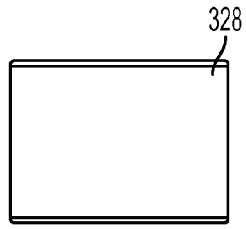
FIG. 5G is an illustration showing a side view of alignment pin 328 depicted in FIG. 3A.

FIG. 5G is an illustration showing a side view of alignment pin 328 depicted in FIG. 3A. Alignment pin 328 can be any shape such as a rod shape, cylindrical shape, rectangular shape, etc. Alignment pin 328 fits into the alignment holes of base plate 320, plate holder 322, conductive layer 324 and top plate 326 and is used to align them all together and secure all of them together along with COSA 200 devices.

Figure 6A:
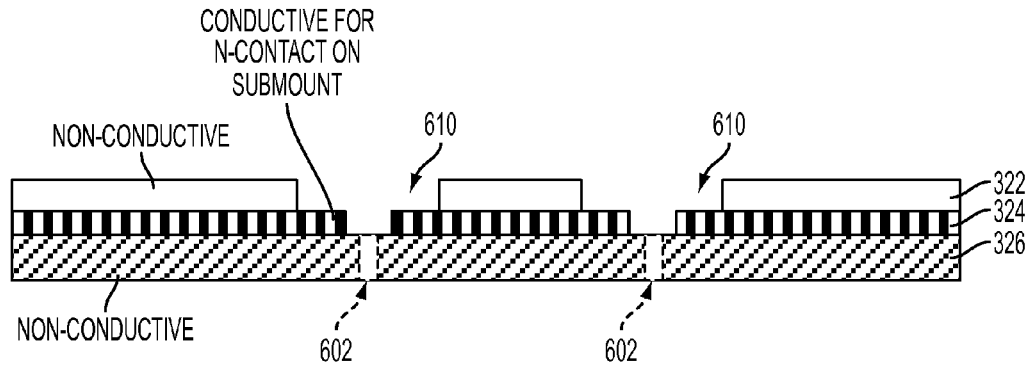
FIG. 6A is an illustration showing a cross sectional view of a COSA burn-in fixture.

FIG. 6A is an illustration showing a cross sectional view of plate holder 322, conductive layer 324 and top plate 326 arranged as part of COSA burn-in fixture 300. Plate holder 322, conductive layer 324 and top plate 326 are stacked such that they form a pocket 610 for a COSA 200 device. In one embodiment, plate holder 322, conductive layer 324 and top plate 326 are stack directly on each other so that plate holder 322 makes direct contact with conductive layer 324 and conductive layer 324 makes direct contact with top plate 326. Plate holder 322 includes through holes 602 that extend completely through plate holder 322.

Figure 6B:
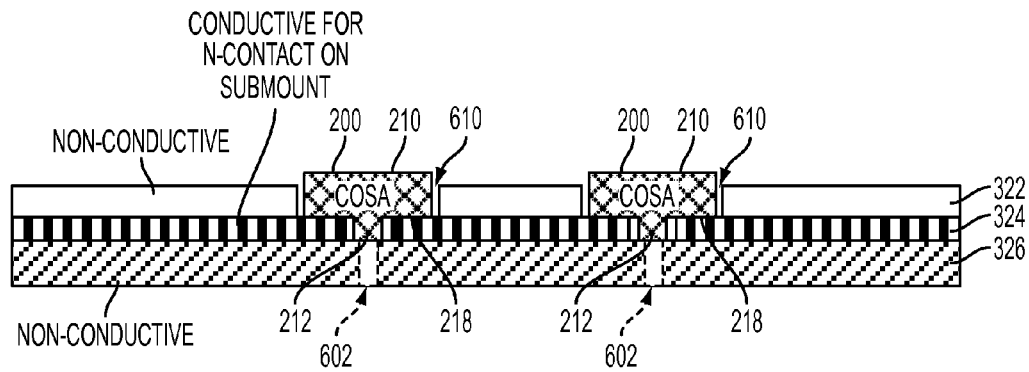
FIG. 6B is an illustration showing a cross sectional view of COSA devices loaded into pockets of a COSA burn-in fixture 600, which is illustrated in FIG. 6A.

FIG. 6B is an illustration showing a cross sectional view of COSA devices 200 loaded into pockets 610 of a COSA burn-in fixture 600 illustrated in FIG. 6A. Pocket 610 is configured to have COSA 200 devices sit inside the pockets and to have the COSA 200 devices make contact with conductive layer 324. Specifically, the first electrical pad 218 disposed on the submount 210 makes electrical contact with conductive layer 324. Since the first electrical pad 218 is electrically coupled to the first electrode of LD 212, the conductive layer 324 is electrically connected to the first electrode of LD 212. When LD 212 is disposed within pocket 610, LD 212 is aligned with through holes 602 and LD 212 does not contact top plate 326. In one embodiment, all COSA 200 devices are in contact with the same conductive layer 324 and therefore all COSA 200 devices share the same electrical contact to the first electrode of their LD 212. In an embodiment where the first electrical contact is an n-contact, all COSA 200 devices share a common n-contact.

Figure 6C:
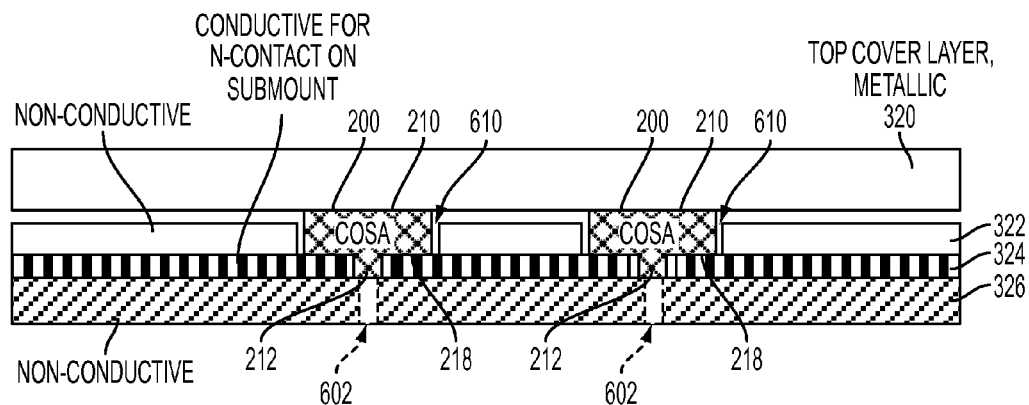
FIG. 6C is an illustration showing a cross sectional view of a COSA burn-in fixture, with loaded COSA devices, which is illustrated in FIG. 6B with a base plate 320 in place.

FIG. 6C is an illustration showing a cross sectional view of a COSA burn-in fixture with loaded COSA 200 devices illustrated in FIG. 6B with base plate 320 in place. Once all COSA 200 devices are loaded into pockets 610 of COSA burn-in fixture 300, base plate 320 is put in place to hold and keep COSA 200 devices in position inside their respective pockets 610. Base plate 320, plate holder 322, conductive layer 324, top plate 326 and all COSA 200 devices are aligned and secured together using alignment pin 328. This configuration puts a force on COSA 200 devices so that the first electrical pad 218 of COSA 200 device presses against conductive layer 324 to provide secure electrical contact.

Figure 7A:
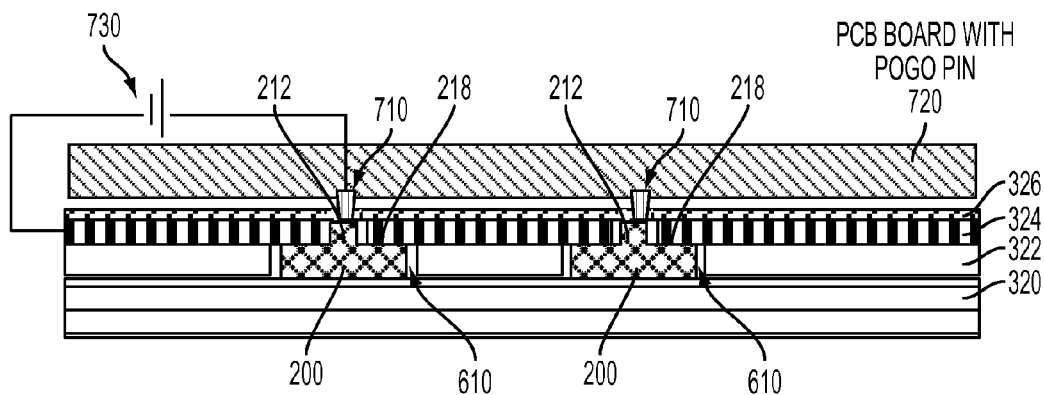
FIG. 7A is an illustration showing a cross sectional view of a COSA mounted in a COSA burn-in fixture with one electrical contact being made using a pogo pin on a printed circuit board (PCB).

FIG. 7A is an illustration showing a cross sectional view of a COSA 200 device mounted in a COSA burn-in fixture 300 with one electrical contact being made using a pogo pin 710 on a PCB 720. COSA 200 devices are disposed in pockets 610, which are formed by stacking plate holder 322, conductive layer 324 and top plate 326 together. COSA 200 devices also have their first electrical pads 218, which are disposed on their submounts 210, making electrical contact with conductive layer 324. Further, since the first electrical pads 218 is electrically coupled to the first electrode of each LD 212, conductive layer 324 is electrically connected to the first electrode of each LD 212. Electrical contact is made to the second electrode of LD 212 using a pogo pin 710 on PCB 720.

PCB 720 is aligned with top plate 326 so that pogo pins 710 align with the top plate openings of top plate 326. Pogo pins 710, which are inserted into the top plate openings, extend through the openings making contact with the second electrode 214 disposed on top of LD 212. A power source 730 is then connected to pogo pins 710 and conductive layer 324. Since conductive layer 324 is electrically connected to the first electrode of LD 212, a complete circuit is formed between the power source 730, pogo pins 710 disposed on PCB 720, LD 212, and conductive layer 324. With this configuration LD 212 can be powered to produce light. In the embodiment where the first electrode is an n-electrode and the second electrode is a p-electrode, pogo pins 710 are connected to the p-electrode of LD 212 and conductive layer 324 is connected to the n-electrode of LD 212.

Figure 7B:
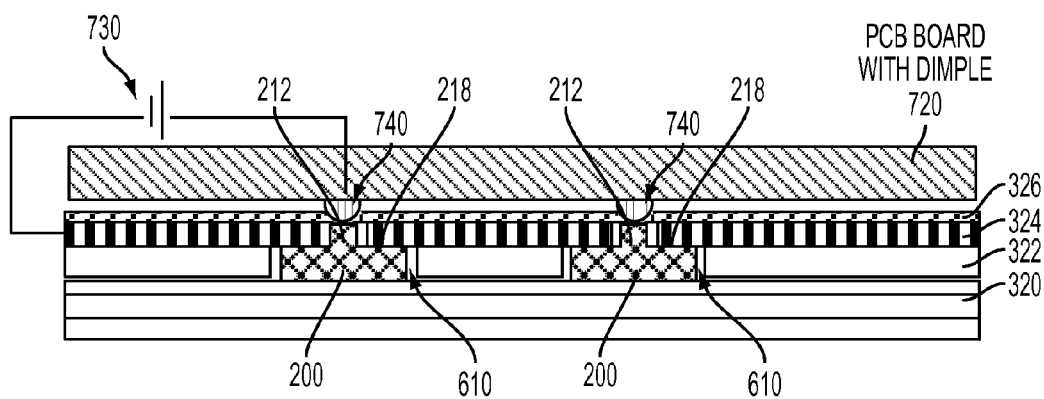
FIG. 7B is an illustration showing a cross sectional view of a COSA mounted in a COSA burn-in fixture with one electrical contact being made using a dimple on a PCB.

FIG. 7B is an illustration showing a cross sectional view of a COSA 200 device mounted in a COSA burn-in fixture 300 with one electrical contact being made using a dimple 740 on a PCB 720. COSA 200 devices are disposed in pockets 610, which are formed by stacking plate holder 322, conductive layer 324 and top plate 326 together. COSA 200 devices also have their first electrical pads 218, which are disposed on their submounts 210, making electrical contact with conductive layer 324. Further, since the first electrical pads 218 is electrically coupled to the first electrode of each LD 212, conductive layer 324 is electrically connected to the first electrode of each LD 212. Electrical contact is made to the second electrode of LD 212 using a dimple 740 on PCB 720.

PCB 720 is aligned with top plate 326 so that dimples 740 align with the top plate openings of top plate 326. Dimples 740, which are inserted into the top plate openings, extend through the openings making contact with the second electrode 214 disposed on top of LD 212. A power source 730 is then connected to dimples 740 and conductive layer 324. Since conductive layer 324 is electrically connected to the first electrode of LD 212, a complete circuit is formed between the power source 730, dimples 740 disposed on PCB 720, LD 212, and conductive layer 324. With this configuration, LD 212 can be powered to produce light. In the embodiment where the first electrode is an n-electrode and the second electrode is a p-electrode, dimples 740 are connected to the p-electrode of LD 212 and conductive layer 324 is connected to the n-electrode of LD 212.

Figure 8:
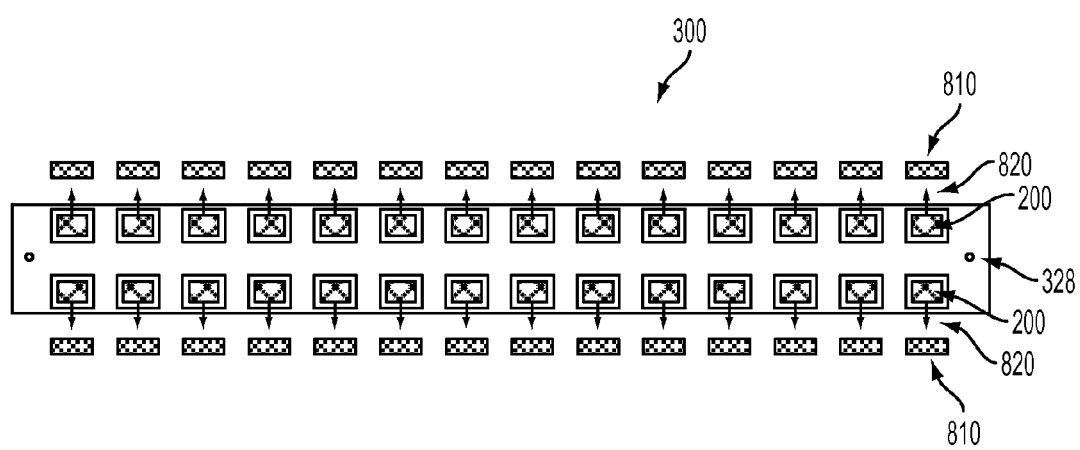

FIG. 8 is an illustration showing two rows of COSA 200 devices mounted in a COSA burn-in fixture 300 orientated to allow measurement of laser power output during burn-in. COSA burn-in fixture 300 is used to identify defective COSA 200 devices by mounting COSA 200 devices in COSA burn-in fixture 300 and measuring pre and post burn-in by independently energizing each LD 212, which is disposed in COSA burn-in fixture 300, in a testing system having an array of detectors 810. Alternatively, COSA burn-in fixture 300 can be mounted into a testing system that has only one detector/tester on each side of COSA burn-in fixture 300. In this alternative tester, LD 212 can be moved in front of a detector/tester by indexing COSA burn-in fixture 300 with mounted COSA 212 devices so that one LD 212 is moved in front of the detector/tester at a time.

COSA burn-in fixture 300 is aligned with a plurality of detectors/testers 810 (28 shown with 14 on each side) so that light 820 generated by each of LD 212, which comes out of the COSA burn-in fixture 300 through the light channels 532, is captured by the detectors/testers 810. The light generated by LD 212 is extracted from the COSA burn-in fixture through the light channels 532 formed in conductive layer 324. The different layers which make up COSA burn-in fixture 300 are aligned with alignment pin 328.

COSA burn-in fixture 300 provides a simple, low cost, easy to manufacture, and easy to load fixture design as compared to other systems available to test laser diodes. COSA burn-in fixture 300 has no moving components which has a distinct maintenance cost advantage, enables a high device loading/fixture area for high throughput and space utilization in the burn-in system, and allows for fast and low cost conversion for new laser and submount configurations, sizes and designs. COSA burn-in fixture 300 also increases the number of COSA 200 devices that can be loaded onto the fixture, facilitates easy insertion of COSA 200 devices into COSA burn-in fixture 300, eliminates delicate complicated wire probes that hold and power LD 212 devices, and allows the ability to quickly disassemble COSA burn-in fixture 300 to allow for cleaning of the individual layers, which do not have any deep pockets and cavities which would make cleaning difficult. COSA burn-in fixture 300 can also hold at least 50 COSA 200 devices per fixture. COSA burn-in fixture 300 is also much less expensive to build and maintain than other commercially available fixtures.

Figure 9:
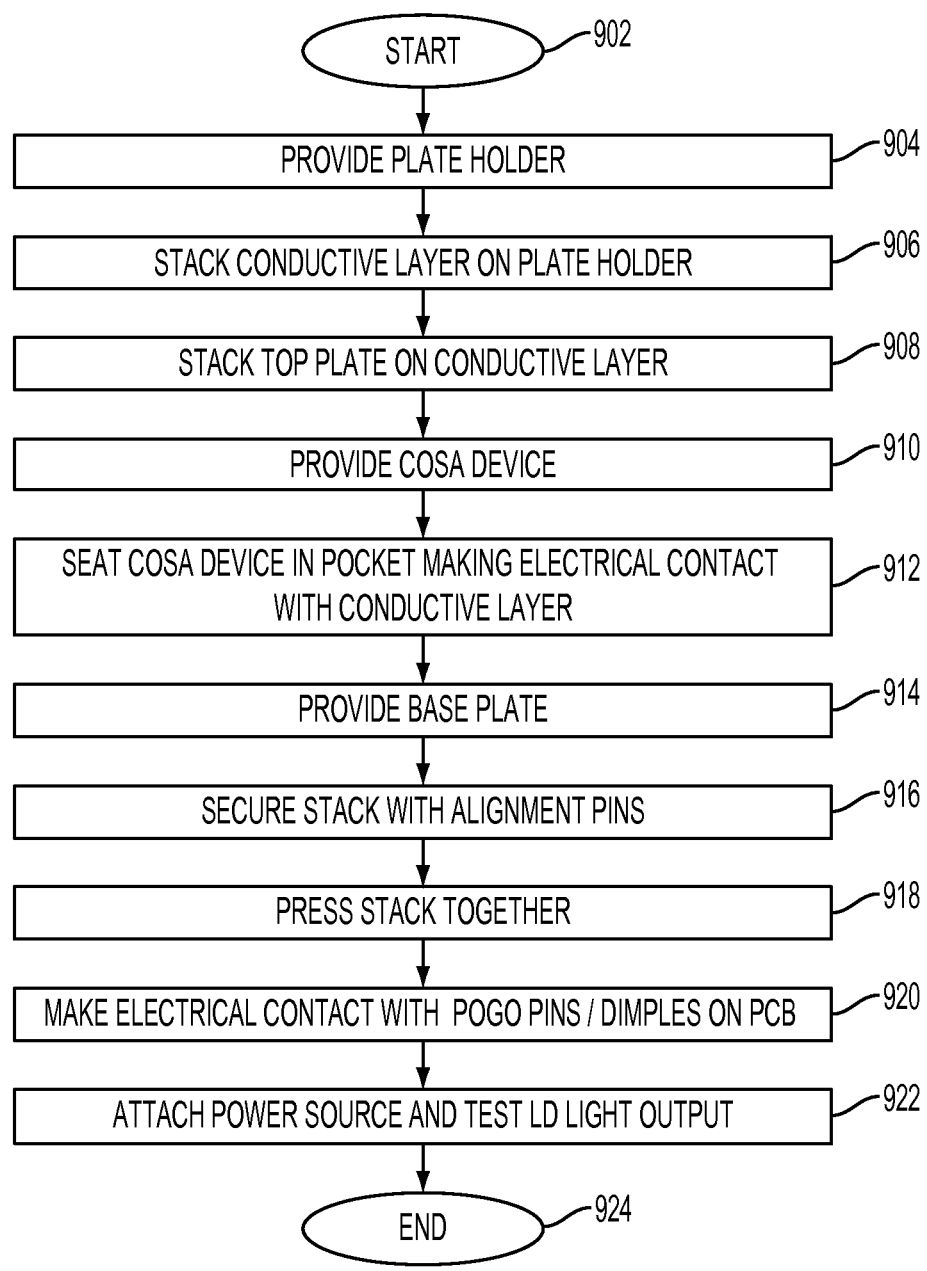
FIG. 9 is a flowchart illustrating an embodiment of a method used to test and screen COSA devices during the COSA fabrication process.

FIG. 9 is a flowchart illustrating an embodiment of a method used to test and screen out COSA devices during the fabrication process of the magnetic disk drive 100. The process starts in operation 902 when process equipment, including detectors/testers, is initialized. In operation 904, a plate holder 322, which is first non-conductive layer, having a plurality of through holes is provided. Next in operation 906, a conductive layer 324 is stacked over plate holder 322. Conductive layer has a plurality of first openings. In operation 908, a top plate 326, which is a non-conductive layer, having a plurality of second openings that are larger than the plurality of first openings, is stacked over conductive layer 324. Top plate 326 is stacked over conductive layer 324 so that each of the plurality of second openings overlays one of the plurality of first openings. The plurality of first openings and the plurality of second openings form a plurality of pockets with a seat on the conductive layer for disposing COSA 200 devices.

In operation 910, a plurality of COSA 200 devices are provided. COSA 200 devices include a submount 210 and an LD 212, where a first electrode of LD 212 is coupled to a first electrical pad 218 on the submount and a second electrode 214 of LD 212 is on LD 212. Next in operation 912, the plurality of COSA 200 devices are disposed in the plurality of pockets with the first electrical pad 218 of the submount 210 making electrical contact with the second conductive layer 324 at the seat. Each LD 212 is disposed within one of the first openings. In operation 914, a base plate 320 is provided and aligned with plate holder 322. In operation 916, base plate 320, plate holder 322, conductive plate 324, and top plate 326, are all aligned and held together with alignment pin 328. In operation 918, the plurality of the first electrical pad 218 on the plurality of submounts 210 are pressed together with conductive layer 324 at the seat by putting a force on base plate 320, plate holder 322, conductive plate 324 and top plate 326, which are all aligned and held together with alignment pin 328.

In operation 920, a PCB 720 having pogo pins 710, or dimples 740, or other connectors is aligned with top plate 326 so that pogo pins 710, or dimples 740, or other connectors extend into the openings of top plate 326 and make electrical contact with the second electrode 214 of LD 212. In operation 922 the circuit is completed by connecting a power source 730 to conductive layer 324 and pogo pins 710, or dimples 740, or other connectors. In operation 922, COSA 200 devices are also tested and screened by placing the attached COSA burn-in fixture in a detector/tester. The process ends in operation 924 when COSA 200 devices are disposed after testing.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A chip-on-submount-assembly (COSA) testing system comprising:
    a first non-conductive layer having a plurality of through holes and a first alignment pin hole pair;
    a second conductive layer having a plurality of first openings and a second alignment pin hole pair, the second conductive layer being disposed over the first non-conductive layer with each of the plurality of first openings overlaying one of the plurality of through holes; and
    a third non-conductive layer having a third alignment pin hole pair and a plurality of second openings that are larger than the plurality of first openings, the third non-conductive layer being disposed over the second conductive layer with each of the plurality of second openings overlaying one of the plurality of first openings; and
    a pair of alignment pins positioned through the first alignment pin hole pair, second alignment pin hole pair, and third alignment pin hole pair,
    wherein the plurality of first openings and the plurality of second openings form a plurality of pockets with a seat on the second conductive layer.

2. The system of claim 1 further comprising a plurality of third opening in the first non-conductive layer, each of the third openings extending from an edge of the first conductive layer to one of the through holes.

3. The system of claim 1 wherein the diameters of the first openings are larger than the diameters of the through holes.

4. The system of claim 1 wherein each of the plurality of through holes is centered with respect to each of the plurality of first openings.

5. The system of claim 1 wherein each of the plurality of through holes is centered with respect to each of the plurality of first openings and each of the plurality of second openings is centered with respect to each of the plurality of first openings.

\* \* \* \* \*